(12) United States Patent
Fujita et al.

(10) Patent No.: US 8,344,404 B2
(45) Date of Patent: Jan. 1, 2013

(54) WAVELENGTH CONVERSION MEMBER AND METHOD FOR MANUFACTURING THE SAME

(75) Inventors: Shunsuke Fujita, Otsu (JP); Yoshio Umayahara, Otsu (JP); Akihiko Sakamoto, Otsu (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 38 days.

(21) Appl. No.: 12/866,922

(22) PCT Filed: Jan. 28, 2009

(86) PCT No.: PCT/JP2009/000327
§ 371 (c)(1),
(2), (4) Date: Aug. 10, 2010

(87) PCT Pub. No.: WO2009/104356
PCT Pub. Date: Aug. 27, 2009

(65) Prior Publication Data
US 2011/0006329 A1  Jan. 13, 2011

(30) Foreign Application Priority Data

Feb. 18, 2008  (JP) .................................. 2008-035880
Mar. 28, 2008  (JP) .................................. 2008-087026
Oct. 17, 2008  (JP) .................................. 2008-268113

(51) Int. Cl.
*H01L 33/00* (2010.01)

(52) U.S. Cl. ................ 257/98; 257/79; 257/95; 257/99; 257/E33.061

(58) Field of Classification Search ..................... 257/79, 257/95, 98, 99
See application file for complete search history.

(56) References Cited

U.S. PATENT DOCUMENTS

| | | | |
|---|---|---|---|
| 6,400,884 B1 | 6/2002 | Matano et al. | |
| 2005/0027041 A1* | 2/2005 | Kusano et al. | 523/324 |
| 2006/0261364 A1 | 11/2006 | Suehiro et al. | |
| 2009/0072418 A1* | 3/2009 | Chang et al. | 264/1.7 |
| 2009/0206352 A1* | 8/2009 | Becker et al. | 257/98 |
| 2010/0140654 A1 | 6/2010 | Hatsuda et al. | |

FOREIGN PATENT DOCUMENTS

| | | |
|---|---|---|
| EP | 1 341 237 A1 | 9/2003 |
| JP | 2001-072463 A | 3/2001 |
| JP | 2003-258308 A | 9/2003 |

(Continued)

OTHER PUBLICATIONS

Official Communication issued in International Patent Application No. PCT/JP2009/000327, mailed on Feb. 24, 2009.

English translation of Official Communication issued in corresponding International Application PCT/JP2009/000327, mailed on Sep. 22, 2011.

*Primary Examiner* — Wai Sing Louie
(74) *Attorney, Agent, or Firm* — Keating & Bennett, LLP (57) ABSTRACT

To provide a wavelength conversion member having good surface accuracy and dimensional accuracy even when processed in various shapes, and a method for manufacturing the same. A method for manufacturing a wavelength conversion member, including the steps of: subjecting a preform made of a powder mixture containing a glass powder and an inorganic phosphor powder to heat treatment, thereby obtaining a sintered powder product; and re-press molding the sintered powder product with a die.

13 Claims, 4 Drawing Sheets

FOREIGN PATENT DOCUMENTS

| | | |
|---|---|---|
| JP | 2004-284893 A | 10/2004 |
| JP | 2005-162602 A | 6/2005 |
| JP | 2007-035798 A | 2/2007 |
| JP | 2007-103978 A | 4/2007 |
| JP | 2007-311743 A | 11/2007 |
| JP | 2008-021795 A | 1/2008 |
| JP | 2008-021868 A | 1/2008 |

* cited by examiner

WAVELENGTH CONVERSION MEMBER AND METHOD FOR MANUFACTURING THE SAME

TECHNICAL FIELD

This invention relates to wavelength conversion members for converting a part of the wavelengths of light emitted from a light source, such as a light-emitting diode (LED), into another wavelength, and to methods for manufacturing the same.

BACKGROUND ART

White LEDs are conventionally expected to be applicable for illumination purpose as next-generation light sources to replace incandescent bulbs and fluorescent lamps. LED devices, such as white LED devices, generally have a structure in which an excitation LED chip is covered with a wavelength conversion member, or a mixture of an inorganic phosphor powder and a resin, by molding. However, heat and light emitted from such an LED chip are collectively applied to a limited region of the molded cover, and thus the resin used for the molded cover may often be colored or deformed in a short time. Therefore, there arises a problem in that a change of the luminescent color occurs in a short time to shorten the lifetime of the LED device. It is considered that this problem will become more serious with increasing output power of LED chips. Hence, there has been a demand to develop a wavelength conversion member having excellent heat resistance.

To address this problem, a wavelength conversion member has been proposed which is made of a fully inorganic solid without using any resin (see, for example, Patent Document 1). Since this wavelength conversion member does not use any resin having poor heat resistance and is made of a fully inorganic solid, it has excellent heat resistance and thus hardly causes thermal degradation.

Patent Document 1: Published Japanese Patent Application No. 2003-258308

DISCLOSURE OF THE INVENTION

Meanwhile, with recent expansion in the application of wavelength conversion members, there has been a demand to further improve them not only in durability but also in the reproducibility of luminescent color and luminescence intensity. Furthermore, the wavelength conversion members are conventionally provided in simple shapes, such as a disc or rectangular shape. However, there is also a demand to form them into various shapes according to the application (such as, for example, a spherical, hemispherical, meniscus lens, conical or thin plate shape).

The luminescent color of an LED device significantly depends on the accuracy of dimensions, such as thickness and shape, of its wavelength conversion member. Therefore, in order to achieve excellent luminescent color reproducibility, these dimensions must be controlled with high accuracy. In addition, because the luminescence intensity varies depending on the surface shape of the wavelength conversion member, the accuracy of the surface shape must be increased.

The wavelength conversion member disclosed in Patent Document 1 is produced by sintering a mixture of a glass powder and an inorganic phosphor powder. Generally, if an inorganic powder is charged into a mold and thermally treated at a temperature near its softening point, a molded form, for example, in a hemispherical shape, can be somehow produced. In this case, however, the sintering process involves shrinkage and deformation due to softening of the inorganic powder, and the resultant wavelength conversion member may be therefore significantly degraded in dimensional accuracy. Particularly in forming the shape as described above, it is very difficult to increase the accuracy of dimensions, such as thickness and shape.

Therefore, in order to obtain a wavelength conversion member having a desired dimensional accuracy, the molded form is required to undergo additional grinding and polishing processes. In this case, however, the final product will have a large number of linear grooves formed thereon owing to polishing and the like and cannot therefore achieve good surface accuracy. Because stress due to external pressure is likely to be concentrated in the linear grooves formed in the surface of the wavelength conversion member, this may cause production of cracks on the member surface. The transmitted light from the inside of the wavelength conversion member is likely to scatter at the linear grooves to produce light loss at the surface of the wavelength conversion member. This may cause the efficiency of light extraction to the outside to be lowered. In addition, the grinding and polishing processes are very troublesome and expensive.

Furthermore, for a wavelength conversion member produced by simply sintering a mixture of a glass powder and an inorganic phosphor powder, air bubbles are likely to remain in the inside of the sintered body, and they may cause increase in the light scattering loss, whereby the luminescence intensity is likely to be lowered.

In view of the above, a problem to be solved of the present invention is to provide a wavelength conversion member having good surface accuracy and dimensional accuracy even when processed in various shapes and provide a method for manufacturing the same.

The inventors have found from various studies that the above problem can be solved by manufacturing a wavelength conversion member by applying a particular processing to an inorganic sintered powder product, and propose the manufacturing method as the present invention.

Specifically, a method for manufacturing a wavelength conversion member according to the present invention is characterized by including the steps of: subjecting a preform made of a powder mixture containing a glass powder and an inorganic phosphor powder to heat treatment, thereby obtaining a sintered powder product; and re-press molding the sintered powder product with a die.

According to the method for manufacturing a wavelength conversion member of the present invention, unlike the method disclosed in Patent Document 1 in which a wavelength conversion member is obtained by simply sintering a mixture of a glass powder and an inorganic phosphor powder, a variety of wavelength conversion members having various shapes can be manufactured with good dimensional accuracy. In particular, the use of the same die enables a constant manufacture of wavelength conversion members having given dimensions. Furthermore, surface scratches and recesses existing in the sintered powder product before re-press molded are planarized and significantly reduced by re-press molding. Therefore, the luminescence intensity of the wavelength conversion member can be increased. Moreover, because the grinding process and the polishing process can be eliminated, a wavelength conversion member having a high surface accuracy (for example, in which the number of linear grooves, which would be produced by polishing or the like, is small) can be manufactured with ease and at low cost. The term "re-press molding" herein refers to re-forming the pressing precursor, such as a sintered powder product, into a predetermined shape by hot pressing using a die.

Secondly, the method for manufacturing a wavelength conversion member according to the present invention is characterized in that the re-press molding is performed at 600° C. or below.

Generally, inorganic phosphor powders may be deactivated by heat. Therefore, the re-press molding temperature (the die temperature) is preferably as low as possible. By performing the re-press molding at 600° C. or below in the above manner, the degradation of the inorganic phosphor powder can be reduced, resulting in increased luminescence intensity of the wavelength conversion member.

Thirdly, the method for manufacturing a wavelength conversion member according to the present invention is characterized in that the re-press molding is performed in a neutral or reductive atmosphere.

Depending on the kind of glass powder, the glass powder may be oxidized and devitrified during the re-press molding. Then, there arises a problem in that the devitrified materials may cause the glass transmittance to be lowered. In some cases, the inorganic phosphor powder itself may be oxidized, whereby the luminescence intensity of the resultant wavelength conversion member can be lowered. By performing the re-press molding in a neutral or reductive atmosphere in these cases, the glass powder or the inorganic phosphor powder can be prevented from being oxidized during the re-press molding, whereby the resultant wavelength conversion member can have stable luminescence intensity.

Fourthly, the method for manufacturing a wavelength conversion member according to the present invention is characterized in that the die has an average surface roughness Ra of 0.5 μm or less.

By setting the average surface roughness of the die used for the re-press molding at a low level, the surface accuracy of the resultant wavelength conversion member can be improved.

Fifthly, the method for manufacturing a wavelength conversion member according to the present invention is characterized in that the difference in coefficient of thermal expansion between the die and the sintered powder product is $50 \times 10^{-7}/°$ C. or less.

By setting the difference in coefficient of thermal expansion between the die used for the re-press molding and the sintered powder product at a small value, the strain due to stress created between the sintered powder product and the die owing to the difference in coefficient of thermal expansion can be reduced. This offers less of a problem of difficulty in removal of the re-press molded product from the die after the re-press molding or less of a problem of production of cracks. Note that in the present invention the coefficient of thermal expansion refers to that in the temperature range of 30° C. to 380° C. and a value measured with a dilatometer.

Sixthly, the method for manufacturing a wavelength conversion member according to the present invention is characterized in that the heat treatment to the preform is performed in a reduced-pressure atmosphere of below one atmospheric pressure.

If the preform made of a powder mixture containing a glass powder and an inorganic phosphor powder is sintered in a reduced-pressure atmosphere of below one atmospheric pressure, air bubbles remaining in the inside of the sintered powder product can be reduced. Thus, the light loss due to light scattering in the resultant wavelength conversion member can be reduced, thereby achieving a high luminescence intensity. In addition, the effect of reducing the oxidation of the glass powder and the inorganic phosphor powder can also be provided.

Seventhly, the method for manufacturing a wavelength conversion member according to the present invention is characterized in that the heat treatment to the preform is performed at 600° C. or below.

By performing the heat treatment at 600° C. or below, the degradation of the inorganic phosphor powder can be reduced, whereby the luminescence intensity of the resultant wavelength conversion member can be increased.

Eighthly, a wavelength conversion member according to the present invention is characterized by being manufactured by any one of the methods of the present invention described so far.

Ninthly, the wavelength conversion member according to the present invention is characterized by comprising a re-press molded product of a sintered powder product of a powder mixture containing a glass powder and an inorganic phosphor powder.

Since the wavelength conversion member according to the present invention comprises a re-press molded product of a sintered powder product, it has a high surface accuracy and therefore has a high luminescence intensity and a feature of very small variations in color reproducibility and luminescence intensity.

Tenthly, the wavelength conversion member according to the present invention is characterized in that the number of linear grooves with a length of 30 μm or more and a depth of 0.05 μm or more existing in the surface thereof is 100 or less on an average per 0.5 mm square.

Thus, cracks originating in linear grooves on the member surface are less likely to be produced by an external pressure, whereby problems of breakage and strength reduction are less likely to occur. Simultaneously, the light scattering loss due to the linear grooves can be reduced, which reduces the loss at the surface of the wavelength conversion member and increases the efficiency of light extraction to the outside. As a result, a wavelength conversion member can be provided which has a high luminescence intensity and very small variations in color reproducibility and luminescence intensity.

Figure 1:
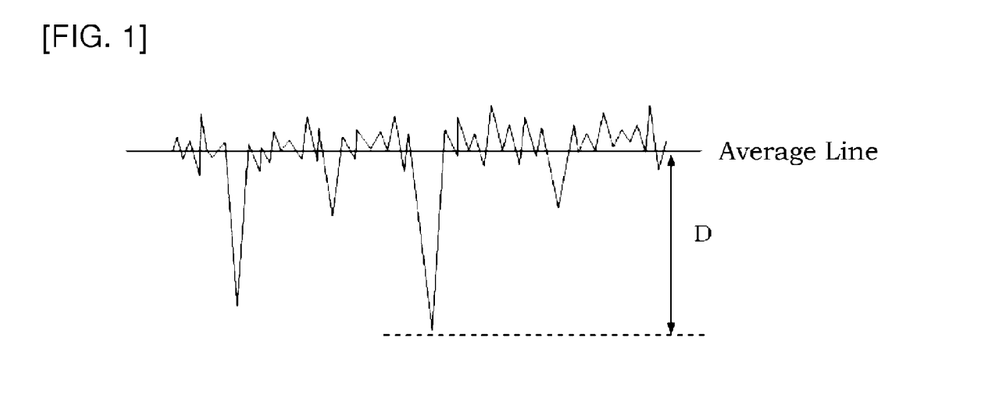
FIG. 1 is a schematic graph of a measurement curve for the surface of a wavelength conversion member measured with a stylus surface roughness measuring instrument.

The lengths of the linear grooves can be measured, for example, by observing an image of the surface of the wavelength conversion member with a scanning electron microscope (SEM). The depths of the linear grooves can be measured, for example, with a stylus surface roughness measuring instrument. Herein, the depth of the linear groove refers to, as shown in FIG. 1, the distance D from the average line to the linear groove bottom end in a measurement curve for the surface shape of the member. Note that in the present invention "linear grooves" refer to those with a depth of 50 μm or less.

Eleventhly, the wavelength conversion member according to the present invention is characterized in that the total light transmittance at a wavelength of 550 nm and a thickness of 1 mm is 10% or more. Here, the total light transmittance is measured using a visible spectro-photometer with an integrating sphere. Specifically, a plate-shaped sample with a thickness of 1 mm is set at the entrance of the integrating sphere, irradiated with spectroscopically separated incident light of a wavelength of 550 nm, and then measured for total light transmittance from the ratio between the integral of the intensities of transmitted light beams emitted towards the integrating sphere in all directions and the intensity of the incident light.

Generally, a sintered powder product made only of a glass powder has a high total light transmittance. However, if the sintered powder product further contains an inorganic phosphor powder, its total light transmittance tends to be significantly lowered by light scattering caused at the interfaces between the glass and inorganic phosphor powders. Since the wavelength conversion member of the present invention has a total light transmittance of 10% or more at a wavelength of 550 nm and a thickness of 1 mm, excitation light and the light converted by the wavelength conversion member penetrate through the wavelength conversion member at a high rate. Therefore, the wavelength conversion member has an excellent luminous efficiency.

Twelfthly, the wavelength conversion member according to the present invention is characterized by having a concave part with a depth of 0.1 mm or more formed in the surface thereof.

Figure 2A:
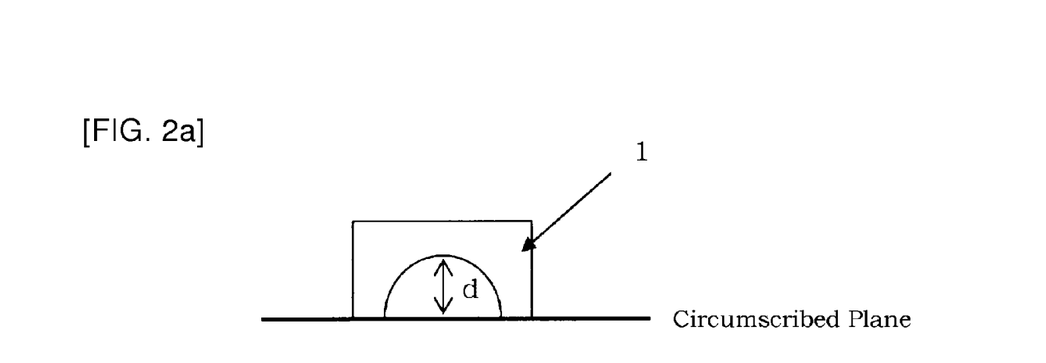
FIGS. 2A and 2B show cross-sectional views of wavelength conversion members according to the present invention.
Figure 2B:
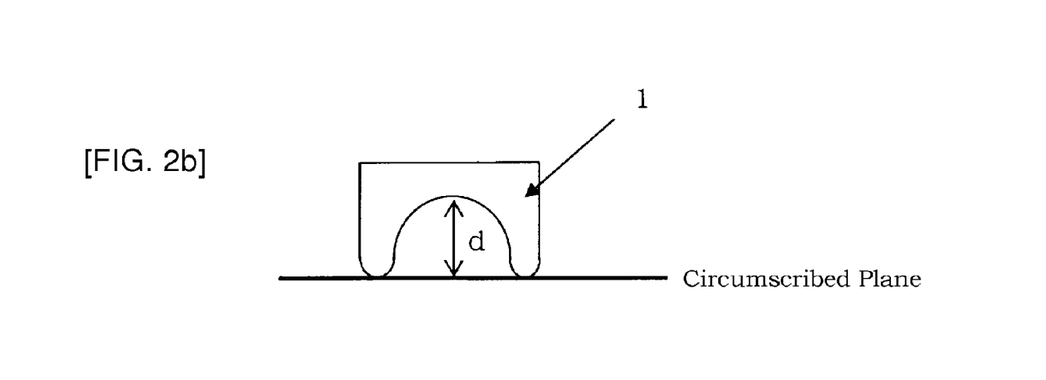

As described previously, wavelength conversion members of various shapes have been recently produced according to the application. They have different luminescence intensities depending on the different shapes. Therefore, in order to achieve a higher luminous flux, the shape of the wavelength conversion member must be optimized. The present invention is also characterized in that a concave part with a depth of 0.1 mm or more is provided in the surface of the wavelength conversion member, more specifically, the surface thereof to be irradiated with excitation light from an LED chip, to increase the specific surface area compared to plate-shaped, spherical, hemispherical and conical wavelength conversion members. Thus, the wavelength conversion member can absorb a larger amount of excitation light and increase the luminescence intensity. Herein, the depth of the concave part refers to, as shown in FIG. 2 (a) or 2(b), the distance d from a circumscribed plane on the periphery of the concave part to the deepest point of the concave part.

Thirteenthly, the wavelength conversion member according to the present invention is characterized in that the concave part is filled with a transparent resin or a low-melting-point glass.

The wavelength conversion member of the present invention can be used for an LED device by placing it on an LED chip. In this case, if a clearance exists between the surface of the wavelength conversion member and the LED chip, a large refractive index difference between the wavelength conversion member and the air causes the tendency to increase the light loss due to reflection at the surface of the wavelength conversion member. By filling the concave part of the wavelength conversion member with a transparent resin or a low-melting-point glass having a higher refractive index than the air in the above manner, the loss of excitation light at the surface of the wavelength conversion member can be reduced. As a result, the luminescence intensity of the wavelength conversion member can be further increased.

Fourteenthly, the wavelength conversion member according to the present invention is characterized in that the refractive index nd of the transparent resin and the low-melting-point glass is 1.4 to 2.0.

Fifteenthly, the wavelength conversion member according to the present invention is characterized in that the transparent resin is a silicone resin.

Sixteenthly, the wavelength conversion member according to the present invention is characterized in that the difference between the refractive index nd of the glass powder and the refractive index nd of the transparent resin or the low-melting-point glass is 0.7 or less.

If there is a large difference between the refractive index nd of the glass powder used as a source material of the wavelength conversion member and the refractive index nd of the transparent resin or low-melting-point glass filled in the concave part of the wavelength conversion member, the light loss due to reflection at the interface between the wavelength conversion member and the transparent resin or low-melting-point glass becomes large, whereby the luminescence intensity of the wavelength conversion member tends to be lowered. On the other hand, if the refractive index difference is 0.7 or less, the light loss due to reflection becomes small, whereby the luminescence intensity of the wavelength conversion member can be increased.

Seventeenthly, the wavelength conversion member according to the present invention is characterized in that the softening point of the glass powder is 600° C. or below. Note that in the present invention the softening point of the glass powder is one measured by DTA (differential thermal analysis).

In order to reduce the thermal degradation of the inorganic phosphor powder, the softening point of the glass powder is preferably as low as possible. If the softening point of the glass powder is 600° C. or below, sintering can be carried out without impairing the luminescence properties of the inorganic phosphor powder. As a result, the luminescence intensity of the wavelength conversion member is likely to increase.

Eighteenthly, the wavelength conversion member according to the present invention is characterized in that the refractive index nd of the glass powder is 1.5 to 2.1.

If the wavelength conversion member has a large refractive index difference between the glass powder and the inorganic phosphor powder, the scattering loss produced at the interfaces between them becomes large. If the refractive index nd of the glass powder is 1.5 to 2.1, the scattering loss can be reduced, whereby the luminescence intensity of the wavelength conversion member can be increased.

Nineteenthly, the wavelength conversion member according to the present invention is characterized in that the glass powder is a $SnO—P_2O_3—B_2O_3$-based glass. The term "-based glass" in the present invention refers to a glass containing ingredients of interest as essential ingredients in its composition. For example, the term "$SnO—P_2O_3—B_2O_3$-based glass" refers to a glass containing $SnO$, $P_2O_5$ and $B_2O_3$ as essential ingredients in its composition. The composition may contain $SnO_2$ as the SnO ingredient.

The $SnO—P_2O_3—B_2O_3$-based glass powder has a relatively low softening point and can be therefore sintered and re-press molded at low temperatures. Thus, the inorganic phosphor powder is less likely to be thermally degraded, whereby the luminescence intensity of the wavelength conversion member is likely to be increased.

Twentiethly, the wavelength conversion member according to the present invention is characterized in that the glass powder has a composition of 35% to 80% by mol SnO, 5% to 40% by mol $P_2O_5$, and 1% to 30% by mol $B_2O_3$.

Twenty-firstly, the wavelength conversion member according to the present invention is characterized in that the composition of the glass powder further contains 0% to 10% by mol $Al_2O_3$, 0% to 10% by mol $SiO_2$, 0% to 10% by mol $Li_2O$, 0% to 10% by mol $Na_2O$, 0% to 10% by mol $K_2O$, 0% to 10% by mol $Li_2O+Na_2O+K_2O$, 0% to 10% by mol MgO, 0% to 10% by mol CaO, 0% to 10% by mol SrO, 0% to 10% by mol BaO, and 0% to 10% by mol MgO+CaO+SrO+BaO.

Twenty-secondly, an LED device according to the present invention is characterized by including the above wavelength conversion member.

LIST OF REFERENCE CHARACTERS

| | |
|---|---|
| 1 | sintered powder product |
| 1' | concave part |
| 2 | transparent resin or low-melting-point glass |
| 3 | LED chip |
| 4 | LED substrate |
| D | depth of linear groove |
| d | depth of concave part |

BEST MODE FOR CARRYING OUT THE INVENTION

A method for manufacturing a wavelength conversion member according to the present invention includes the steps of: subjecting a preform made of a powder mixture containing a glass powder and an inorganic phosphor powder to heat treatment, thereby obtaining a sintered powder product; and re-press molding the sintered powder product with a die.

First, a powder mixture containing a glass powder and an inorganic phosphor powder is molded, such as by press molding, to obtain a preform.

The glass powder used for the wavelength conversion member of the present invention is not particularly limited. Examples of the glass powder include $SnO-P_2O_5-B_2O_3$-based, $SiO_2-B_2O_3$-based, $SiO_2-B_2O_3-Al_2O_3$-based, $SiO_2-B_2O_3-ZnO$-based, and $SiO_2-B_2O_3-TiO_2-ZnO-Nb_2O_5$-based glass compositions. Preferred among them are $SnO-_2O_5-B_2O_2$-based glasses because they can be sintered and re-press molded at low temperatures, specifically, at 600° C. or below.

The particularly preferred $SnO-P_2O_5-B_2O_3$-based glasses are those having a composition of 35% to 80% by mol SnO, 5% to 40% by mol $P_2O_5$, and 1% to 30% by mol $B_2O_3$. Furthermore, the glass composition preferably further contains as optional ingredients 0% to 10% $Al_2O_2$, 0% to 10% $SiO_2$, 0% to 10% $Li_2O$, 0% to 10% $Na_2O$, 0% to 10% $K_2O$, 0% to 10% $Li_2O+Na_2O+K_2O$, 0% to 10% MgO, 0% to 10% CaO, 0% to 10% SrO, 0% to 10% BaO, and 0% to 10% MgO+CaO+SrO+BaO.

The reasons why the glass composition is defined as above are as follows.

SnO is an ingredient that serves as a glass former and decreases the glass softening point. The content thereof is 35% to 80%, preferably 50% to 70%, and more preferably 55% to 65%. If the SnO content is lower than the above range, the glass softening point tends to rise, which elevates the sintering temperature and may thereby degrade the inorganic phosphor powder. On the other hand, if the SnO content is higher, devitrified materials derived from Sn may be precipitated in the glass to make the glass powder less likely to vitrify, whereby the glass transmittance tends to decrease and the luminescence intensity of the wavelength conversion member is eventually likely to decrease.

$P_2O_5$ is an ingredient that serves as a glass former. The content is 5% to 40%, preferably 10% to 30%, and more preferably 15% to 24%. If the $P_2O_5$ content is lower than the above range, the glass powder becomes less likely to vitrify. On the other hand, if the $P_2O_5$ content is higher, the glass softening point tends to rise, and the glass powder is thereby less likely to be sintered at low temperatures. In addition, the weather resistance of glass tends to significantly decrease.

$B_2O_3$ is an ingredient for increasing the weather resistance. $B_2O_3$ is also an ingredient for stabilizing glass. The content thereof is 1% to 30%, preferably 2% to 20%, and more preferably 4% to 18%. If the $B_2O_3$ content is lower than the above range, the above effects are less likely to be achieved. On the other hand, if the $B_2O_3$ content is higher, the weather resistance is likely to decrease rather than increase. In addition, the glass softening point tends to rise and the ingredient balance of the glass composition at low temperatures is impaired, whereby the glass powder is less likely to be sintered.

$Al_2O_3$ is an ingredient for stabilizing glass. The content thereof is 0% to 10%, preferably 0% to 7%, and more preferably 1% to 5%. If the $Al_2O_3$ content is higher than the above range, the glass softening point tends to rise. As a result, the glass powder is less likely to be sintered at low temperatures, and the sintering temperature rises, whereby the inorganic phosphor powder tends to be degraded.

$SiO_2$ is, like $Al_2O_3$, an ingredient for stabilizing glass. The content thereof is 0% to 10%, preferably 0% to 7%, and more preferably 0% to 5%. If the $SiO_2$ content is higher than the above range, the glass softening point tends to rise, and the glass powder is thereby less likely to be sintered at low temperatures. In addition, the glass is likely to be separated in phase.

$Li_2O$, $Na_2O$ and $K_2O$ are ingredients for lowering the glass softening point and stabilizing glass. Each of the contents is 0% to 10%, preferably 0% to 7%, and more preferably 0% to 5%. If each of the contents of $Li_2O$, $Na_2O$ and $K_2O$ is too high, the ingredient balance of the glass composition at low temperatures is impaired rather than improved, whereby the glass is likely to be made significantly unstable and is less likely to vitrify. Note that the total amount of $Li_2O$, $Na_2O$ and $K_2O$ is 0% to 10%, preferably 0% to 7%, and more preferably 1% to 5%. If the total amount of these ingredients is above 10%, the glass is likely to be made unstable and is less likely to vitrify.

MgO, CaO, SrO and BaO are ingredients for stabilizing glass to facilitate vitrification. Each of the contents is 0% to 10%, preferably 0% to 7%, and more preferably 0% to 5%. If each of the contents of these ingredients is too high, the ingredient balance of the glass composition at low temperatures is impaired rather than improved, the glass is likely to be devitrified, and the glass transmittance tends to decrease, resulting in decrease in the luminescence intensity of the wavelength conversion member. Note that the total amount of MgO, CaO, SrO and BaO is 0% to 10%, preferably 0% to 7%, and more preferably 0% to 5%. If the total amount of these ingredients is too high beyond 10%, the ingredient balance of the glass composition at low temperatures is impaired rather than improved, the glass is likely to be devitrified, the glass transmittance tends to decrease, and the luminescence intensity of the wavelength conversion member eventually tends to decrease.

Besides the above ingredients, one or more various other ingredients can be added at an amount where the effects of the present invention are not impaired. For example, ZnO, $Ta_2O_5$, $TiO_2$, $Nb_2O_5$, $Gd_2O_2$ and/or $La_2O_2$ may be added to 10% in total.

The softening point of the glass powder is 600° C. or below, preferably 550° C. or below, more preferably 500° C. or below, and still more preferably 400° C. or below. If the softening point is above 600° C., the sintering temperature becomes high, whereby the inorganic phosphor powder is likely to be degraded and the luminescence intensity of the wavelength conversion member tends to decrease. In addition, re-press molding at low temperatures becomes difficult to perform.

The inorganic phosphor powder used in the present invention is not particularly limited so long as it has a luminescence peak in the visible range. Such inorganic phosphor powders include oxides, nitrides, oxynitrides, chlorides, oxychlorides, sulfides, oxysulfides, halides, chalcogenides, aluminates, halophosphoric acid chlorides, and YAG-based compounds. These kinds of inorganic phosphor powders are used singly or in a mixture of two or more of them. Note that in the present invention the visible range refers to the range from 380 to 780 nm.

The content of inorganic phosphor powder in the powder mixture can be controlled so that the luminous efficiency and chromaticity of the wavelength conversion member can be optimized. If the proportion of inorganic phosphor powder in the powder mixture is too large, the powder mixture is less likely to be sintered and the porosity of the wavelength conversion member is likely to be high. As a result, there may arise a problem in which excitation light is less likely to efficiently be applied to the inorganic phosphor powder and a problem in which the mechanical strength of the wavelength conversion member decreases. On the other hand, if the proportion of inorganic phosphor is too small, this makes it difficult to provide a sufficient luminescence intensity. From these points of view, the content of inorganic phosphor in the powder mixture is 0.01% to 30% by mass, preferably 0.05% to 20% by mass, and more preferably 0.08% to 15% by mass.

If the light scattering of the resultant wavelength conversion member is desired to be increased, a glass powder having a small particle size can be used. If the light scattering is desired to be reduced, a glass powder having a large particle size can be used. Specifically, the maximum particle size $D_{max}$ is preferably 200 μm or less (particularly preferably 45 to 150 μm and more preferably 45 to 105 μm), and the average particle size $D_{50}$ is preferably 2 μm or more (particularly preferably 10 to 20 μl). If the maximum particle size of the glass powder is above 150 μm, the resultant wavelength conversion member includes dispersed transparent parts formed by coarse glass particles and are less likely to scatter light. Thus, the wavelength conversion member cannot become a homogenous scatterer and is likely to emit light where the chromaticity of excitation light is enhanced. If the average particle size $D_{50}$ is below 2 μm, the resultant wavelength conversion member excessively scatters light and thereby significantly lowers the transmissivity to excitation light. Thus, the wavelength conversion member is likely not only to lower the luminous efficiency but also to emit light where chromaticity of the wavelength converted by the inorganic phosphor powder is enhanced. Note that in the present invention the maximum particle size $D_{max}$ and the average particle size $D_{50}$ refer to those measured by laser diffractometry.

The refractive index nd of the glass powder is preferably 1.5 to 2.1, more preferably 1.6 to 2.05, and still more preferably 1.7 to 2.0. If the refractive index nd is lower than 1.5, the refractive index difference between the glass and inorganic phosphor powders is large, whereby the light scattering loss produced at the interfaces between them tends to increase. As a result, the luminescence intensity of the wavelength conversion member is likely to decrease. On the other hand, if the refractive index nd is higher than 2.1, the glass often contains a heavy metal element. The heavy metal element causes the transmittance of the wavelength conversion member to be likely to be lowered by its coloration or light absorption. As a result, the luminescence intensity tends to decrease.

The powder mixture used may be one made only of a glass powder and an inorganic phosphor powder but may further contain a high-softening-point glass or another one or more inorganic powders, such as alumina or silica, at an amount where the effects of the present invention are not impaired, for the purposes of such as improvement in the strength of the wavelength conversion member and control on chromaticity, orientation and scattering properties of the wavelength conversion member. The content of these inorganic powders is preferably 0.01% to 50% by mass and more preferably 0.05% to 20% by mass in total in the wavelength conversion member.

The shape of the preform is not particularly limited because of later subjecting to re-press molding, and may be one which is relatively easily produced, such as a tablet (disc or columnar) shape or a rectangular shape.

Next, the preform is subjected to heat treatment, thereby obtaining a sintered powder product.

The temperature of the heat treatment to the preform (sintering temperature) is 600° C. or below, preferably 500° C. or below, and more preferably 400° C. or below. If the heat treatment temperature is above 600° C., the inorganic phosphor powder is likely to be degraded by heat, and the luminescence intensity of the wavelength conversion member tends to decrease.

The heat treatment to the preform is performed in a reduced-pressure atmosphere of below one atmospheric pressure ($1.013 \times 10^5$ Pa), preferably 1000 Pa or below, and more preferably 400 Pa or below. If the atmosphere during the heat treatment is one atmospheric pressure or above, air bubbles are likely to remain in the inside of the sintered powder product, which may cause a light loss due to light scattering. As a result, the luminescence intensity of the wavelength conversion member tends to decrease. As for the heat treatment atmosphere, all of the heat treatment processes from temperature increase to firing and then to temperature decrease (heat treatment profile) may be put under conditions of below one atmospheric pressure. Alternatively, only part of the processes that may easily cause degradation of the inorganic phosphor powder may be put under conditions of below one atmospheric pressure.

Then, the sintered powder product is re-press molded, whereby a wavelength conversion member can be obtained.

The temperature during re-press molding of the sintered powder product is 600° C. or below, preferably 500° C. or below, and more preferably 400° C. or below. If the temperature during re-press molding is above 600° C., the inorganic phosphor powder is likely to be degraded by heat during re-press molding and the luminescence intensity of the wavelength conversion member tends to decrease.

The re-press molding is preferably performed in a neutral atmosphere or a reductive atmosphere. Thus, the glass powder or the inorganic phosphor powder is prevented from being oxidized during re-press molding, whereby the resultant wavelength conversion member can have stable luminescence intensity. Note that the neutral atmosphere refers to, for example, an inert gas atmosphere, such as Ar, or a $N_2$ atmosphere. The reductive atmosphere refers to, for example, a $H_2$ atmosphere or a CO atmosphere.

After the re-press molding, the surface of the wavelength conversion member may be altered to lower the luminescence intensity. Particularly with the use of a $SnO$—$P_2O_5$—$B_2O_3$-based glass, the surface part of the wavelength conversion member is likely to be altered. In this case, the surface of the wavelength conversion member after the re-press molding is preferably subjected to a post-processing to remove the altered surface part of the wavelength conversion member. Specific examples of the post-processing include etching, polishing and ultrasonic cleaning. Thus, the luminescence intensity of the wavelength conversion member can be further increased.

During etching, for example, an acid solution, such as sulfuric acid, hydrochloric acid or hydrofluoric acid, can be used. The concentration of these acid solutions is about 0.1% to 10%. The etching time is set within the range from one second to several tens of hours according to the concentration of the acid solution.

During polishing, a slurry of powder, such as silicon carbide (SiC), alumina or diamond, can be used. The particle size of the powder that can be used is about 0.1 to 6 μm.

The etching or polishing may be used in combination with ultrasonic cleaning. Thus, the efficiency of etching or polishing can be increased.

The average surface roughness Ra of the die used for re-press molding is 0.5 μm or below, preferably 0.1 μm or below, and more preferably 0.05 μm or below. If the average surface roughness Ra of the die is above 0.5 μm, the resultant wavelength conversion member tends to have poor surface accuracy. As a result, the light scattering loss at the surface of the wavelength conversion member becomes large, whereby the luminescence intensity is likely to decrease.

Depending on the surface shape of the mold used, linear ridges may be formed on the surface of the wavelength conversion member. However, such linear ridges are less likely to cause light scattering, unlike linear grooves formed such as by polishing. Therefore, there is substantially no possibility of lowering the efficiency of light extraction to the outside.

The difference in coefficient of thermal expansion between the die used for re-press molding and the sintered powder product is $50 \times 10^{-7}/°$ C. or less, preferably $30 \times 10^{-7}/°$ C. or less, and more preferably $25 \times 10^{-7}/°$ C. or less. If the difference in coefficient of thermal expansion between the die and the sintered powder product is above $50 \times 10^{-7}/°$ C., stress and strain produced between the die and the sintered powder product become large, particularly when the sintered powder product is re-press molded into a relatively complicated shape, such as a meniscus lens shape. Thus, it becomes hard to remove the re-press molded product from the die, and in some cases cracks may be produced.

Before being subjected to re-press molding, the sintered powder product is preferably ground and polished to arrange it into an easily re-press moldable shape, thereby producing a re-press molding precursor. By doing so, a wavelength conversion member can be obtained which has more excellent dimensional accuracy and surface accuracy.

Next, the wavelength conversion member of the present invention will be described.

The wavelength conversion member of the present invention comprises a re-press molded product of a sintered powder product made of a powder mixture containing a glass powder and an inorganic phosphor powder.

In the surface of the wavelength conversion member of the present invention, the number of linear grooves with a length of 30 μm or more and a depth of 0.05 μm or more is preferably 100 or less, more preferably 50 or less, still more preferably 20 or less, and particularly preferably 10 or less, on an average per 0.5 mm square. Most preferably, no linear groove exists in the surface. If the number of linear grooves per 0.5 mm square is above an average of 100, this is likely to cause occurrence of cracks in the member surface. In addition, a light loss due to the linear grooves is likely to occur in the member surface, which may cause the efficiency of light extraction to the outside to be lowered.

As already described, wavelength conversion members obtained by simply sintering an inorganic powder cause thermal shrinkage during sintering, which makes it very difficult to increase the dimensional accuracy. Since the wavelength conversion member of the present invention comprises a re-press molded product of a sintered powder product, it can have various shapes different from conventional simple shapes, such as a tablet and a rectangle, of conventional ones. Specifically, the possible shapes include spherical, hemispherical, meniscus lens, conical, and thin plate shapes.

Materials of the glass powder and the inorganic phosphor powder which can be applied are as described previously. The content of inorganic phosphor powder in the wavelength conversion member can be controlled so that the luminous efficiency (lm/W) and chromaticity of the wavelength conversion member can be optimized. Specifically, the content of inorganic phosphor powder is 0.01% to 30% by mass, preferably 0.05% to 20% by mass, and more preferably 0.08% to 15% by mass.

When the wavelength conversion member is excited by a excitation light in a calibrated integrating sphere, the luminous efficiency is calculated by dividing the total luminous flux (lm) composed of the excitation light penetrated through the wavelength conversion member and the light converted by the wavelength conversion member, by the electric power (W) applied to the excitation light source. The chromaticity is calculated from luminescence spectra measured in the integrating sphere.

The wavelength conversion member of the present invention may further contain one or more of the previously described inorganic powders other than the glass powder and the inorganic phosphor powder. The content of these inorganic powders is 0.01% to 50% by mass and preferably 0.05% to 20% by mass in total in the wavelength conversion member.

The total light transmittance of the wavelength conversion member at a wavelength of 550 nm and a thickness of 1 mm is preferably 10% or more, more preferably 15% or more, and still more preferably 20% or more. If the total light transmittance is below 10%, the excitation light and the light converted by the wavelength conversion member penetrate through the wavelength conversion member at a small rate, whereby the luminous efficiency tends to decrease.

The wavelength conversion member of the present invention preferably has a concave part in the surface thereof in order to further increase the luminescence intensity. The depth of the concave part is preferably 0.1 mm or more, more preferably 0.5 mm or more, still more preferably 1 mm or more, particularly preferably 2 mm or more, and most preferably 5 mm or more. If the depth of the concave part is below 0.1 mm, the effect of the wavelength conversion member increasing the luminescence intensity is less likely to be obtained. The upper limit of the depth is not particularly limited. However, in consideration of the size of a wavelength conversion member for general applications, the upper limit is 20 mm or less, and preferably 10 mm or less.

Examples of the shape of the concave part include spherical, hemispherical, semioval-spherical, conical, pyramid, cylindrical, and prismatic shapes. However, the shape of the concave part is not limited to these shapes. The preferred shape among them is a hemispherical shape because of ease of increasing the luminescence intensity of the wavelength conversion member.

The concave part of the wavelength conversion member can be formed by using a male die having a raised part with a height of 0.1 mm or more in re-press molding the sintered powder product.

In the wavelength conversion member according to the present invention, the concave part formed in the surface thereof is preferably filled with a transparent resin or a low-melting-point glass.

The transparent resin is not particularly limited so long as it is less likely to be degraded by heat of excitation light. Examples thereof include silicone resins and epoxy resins. The preferred transparent resin among them is silicone resins because of their good heat resistance. Furthermore, because of simplicity of the manufacturing process of an LED device, thermosetting resins are preferably used.

The low-melting-point glass is also not particularly limited, so long as it has a lower melting point than the glass powder used as a source material of the wavelength conversion member and is less likely to be degraded by heat of excitation light. Various kinds of glass can be used as the low-melting-point glass. The softening point of the low-melting-point glass is preferably 550° C. or below, more preferably 500° C. or below, still more preferably 450° C. or below, and particularly preferably 350° C. or below.

The range of refractive indices nd of the transparent resin and the low-melting-point glass is preferably 1.4 to 2.0, more preferably 1.45 to 1.9, and still more preferably 1.49 to 1.85. If the refractive index nd of the transparent resin and the low-melting-point glass is below 1.4 or above 2.0, the difference in refractive index between the low-melting-point glass and the wavelength conversion member becomes large, whereby the light loss due to reflection at the wavelength conversion member surface is likely to be large. As a result, the luminescence intensity of the wavelength conversion member tends to decrease.

The difference between the refractive index nd of the glass powder and the refractive index nd of the transparent resin or the low-melting-point glass is preferably 0.7 or less, more preferably 0.6 or less, and still more preferably 0.5 or less. If the refractive index difference is greater than 0.7, the light loss due to reflection at the interface between the wavelength conversion member and the transparent resin or the low-melting-point glass tends to be large.

The LED device according to the present invention is characterized by including the above wavelength conversion member. For example, the LED device is formed so that the wavelength conversion member is fixed in close contact with or spaced apart from an LED for emitting blue light or ultraviolet light. For example, blue and yellow have a complementary color relationship. Therefore, if an LED for emitting blue light is combined with a wavelength conversion member containing a yellow phosphor powder, a white LED device can be produced.

Embodiments of the LED device according to the present invention are shown in FIGS. 3 to 10. In FIGS. 3 to 10, each LED device is formed so that a concave part 1' is formed in the surface of a wavelength conversion member 1 and the wavelength conversion member 1 is bonded onto an LED composed of an LED chip 3 and an LED substrate 4. The concave part 1' is filled with a transparent resin or a low-melting-point glass to create no air layer between the wavelength conversion member 1 and each of the LED chip 3 and the LED substrate 4. Thus, the light loss due to reflection originated from the air layer can be reduced, and an LED device having a high luminescence intensity can be provided.

Figure 3:
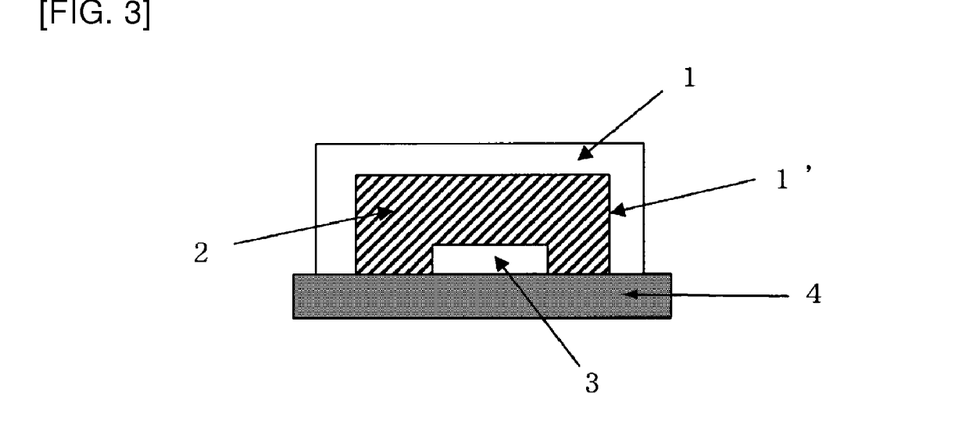
FIG. 3 is a cross-sectional view showing a first embodiment of an LED device according to the present invention.

In FIG. 3, a cylindrical (or prismatic) concave part 1' is formed in the surface of a cylindrical (or prismatic) wavelength conversion member 1.

Figure 4:
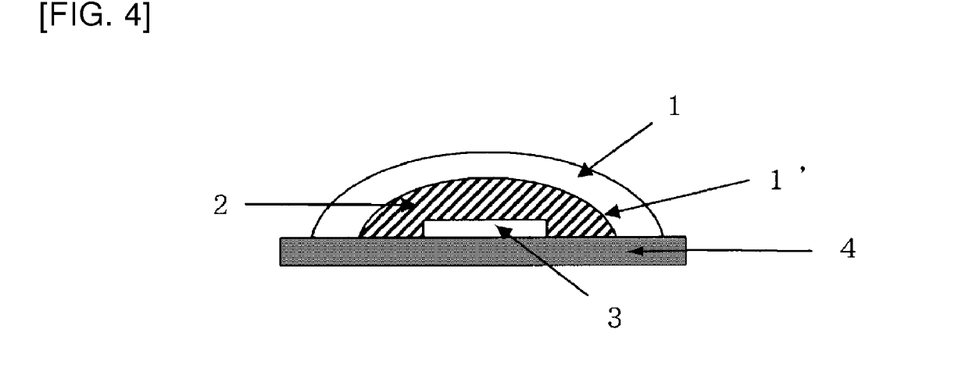
FIG. 4 is a cross-sectional view showing a second embodiment of the LED device according to the present invention.

In FIG. 4, a semioval-spherical concave part 1' is formed in the surface of a semioval-spherical wavelength conversion member 1.

Figure 5:
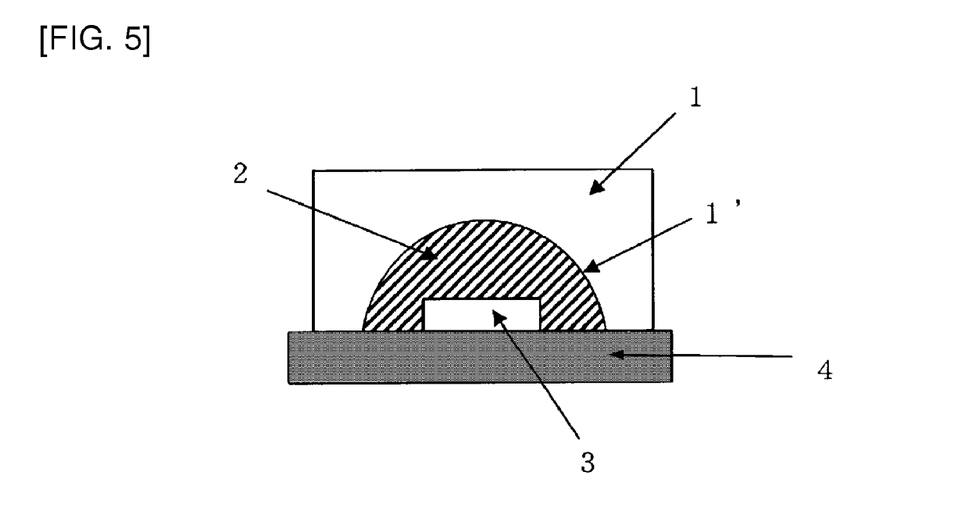
FIG. 5 is a cross-sectional view showing a third embodiment of the LED device according to the present invention.

In FIG. 5, a hemispherical concave part 1' is formed in the surface of a cylindrical (or prismatic) wavelength conversion member 1.

Figure 6:
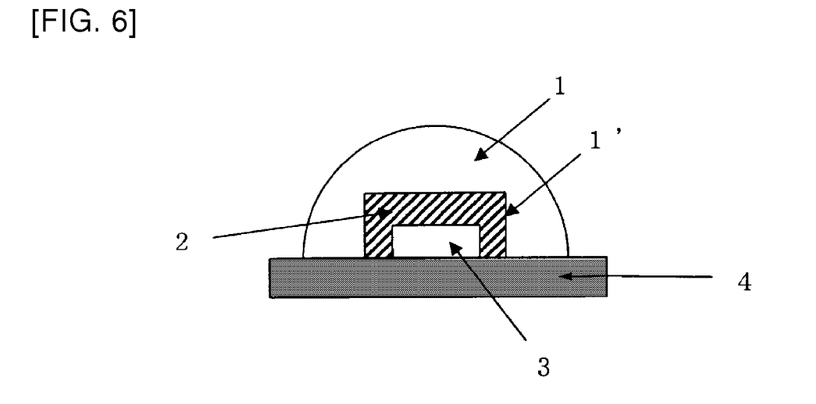
FIG. 6 is a cross-sectional view showing a fourth embodiment of the LED device according to the present invention.

In FIG. 6, a cylindrical (or prismatic) concave part 1' is formed in the surface of a hemispherical wavelength conversion member 1.

Figure 7:
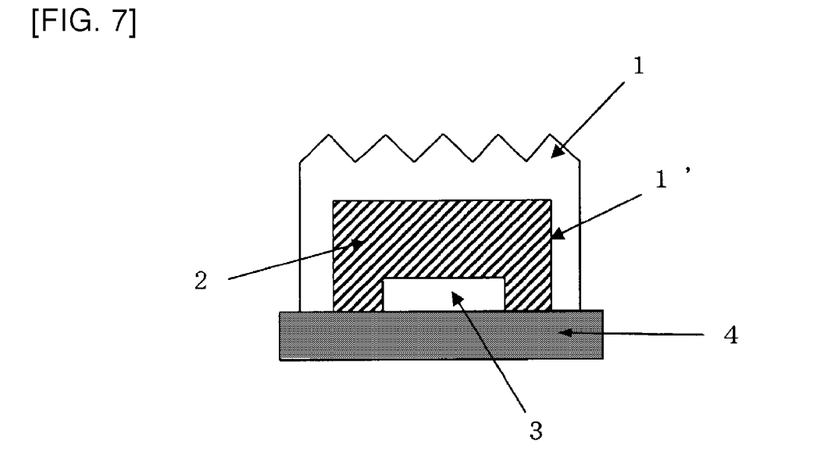
FIG. 7 is a cross-sectional view showing a fifth embodiment of the LED device according to the present invention.
Figure 8:
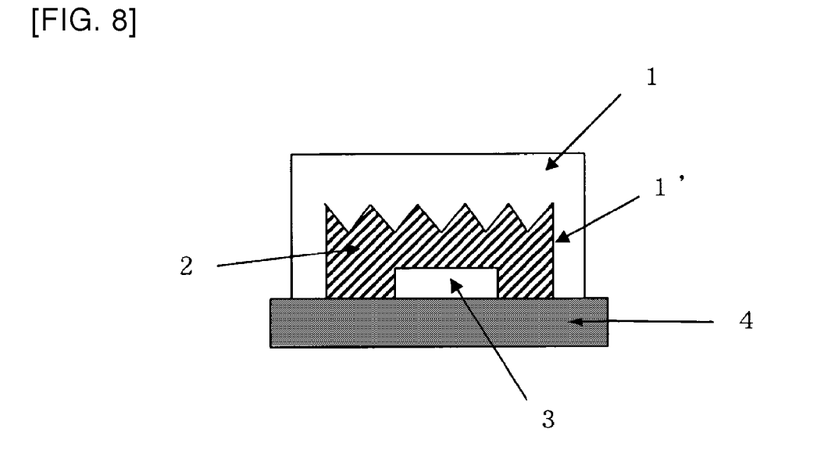
FIG. 8 is a cross-sectional view showing a sixth embodiment of the LED device according to the present invention.
Figure 9:
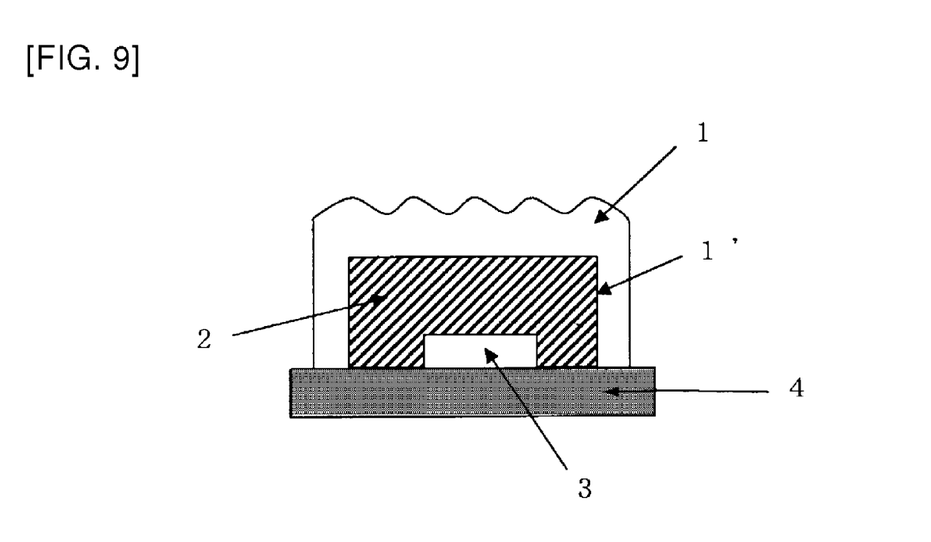
FIG. 9 is a cross-sectional view showing a seventh embodiment of the LED device according to the present invention.

Also in FIGS. 7 to 9, as in FIG. 3, LED devices are each formed so that a cylindrical (or prismatic) concave part 1' is formed in the surface of a cylindrical (or prismatic) wavelength conversion member 1. In addition, the surface of the wavelength conversion member or the surface of the concave part partially has a corrugated shape.

Figure 10:
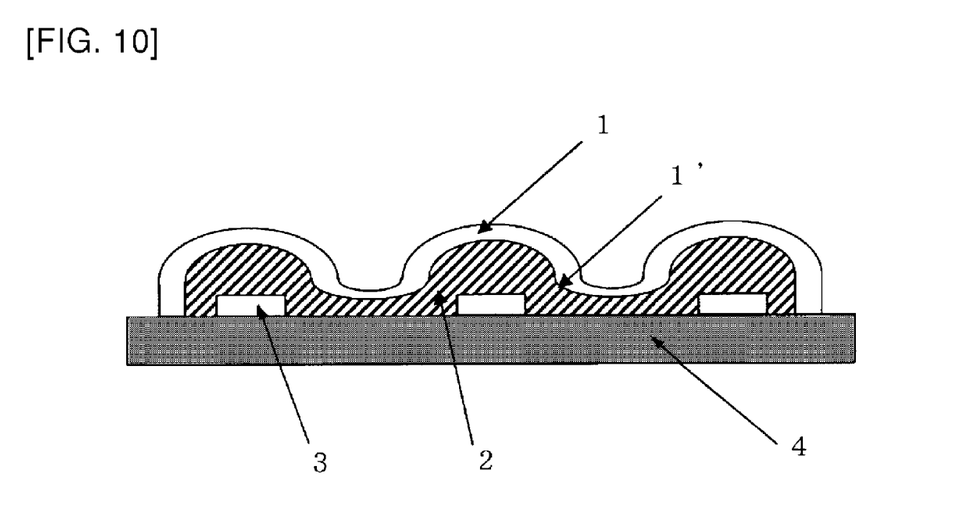
FIG. 10 is a cross-sectional view showing an eighth embodiment of the LED device according to the present invention.

In FIG. 10, a wavelength conversion member 1 composed of a plurality of interconnected substantially hemispherical wavelength conversion members has a plurality of interconnected substantially hemispherical concave parts 1' formed in the surface thereof corresponding to each of the substantially hemispherical wavelength conversion members. In addition, a plurality of LED chips are disposed corresponding to each of the individual substantially hemispherical wavelength conversion members.

Since the wavelength conversion member according to the present invention is manufactured by re-press molding, it can be imparted such a wide variety of shapes by selecting the die as appropriate. Therefore, the LED device can be provided suitable for various applications.

Examples of a method for manufacturing an LED device in which the concave part of the wavelength conversion member is filled with a transparent resin include a method of pouring a liquid thermosetting resin into the concave part of the wavelength conversion member, bringing the wavelength conversion member into close contact with the LED chip and curing the resin by heat application to bond the wavelength conversion member to the LED chip, and a method of pouring a liquid thermosetting resin into the concave part of the wavelength conversion member, partly curing the resin by heat application, bringing the wavelength conversion member into close contact with the LED chip and curing the resin by further heat application to bond the wavelength conversion member to the LED chip.

Examples of a method for manufacturing an LED device in which the concave part of the wavelength conversion member is filled with a low-melting-point glass include a method of charging a powdered or bulk low-melting-point glass into the concave part of the wavelength conversion member, applying heat to the glass to its softening point to bring the glass into close contact with the concave part of the wavelength conversion member, putting the wavelength conversion member on the LED chip and applying heat again to the glass to the softening point to bond the wavelength conversion member to the LED chip, and a method of pouring a melt of a low-melting-point glass directly into the concave part of the wavelength conversion member, cooling the melt to vitrify it to bring the glass into close contact with the concave part of the wavelength conversion member, putting the wavelength conversion member on the LED chip and applying heat to the low-melting-point glass to its softening point to bond the wavelength conversion member to the LED chip.

EXAMPLES

Hereinafter, the present invention will be described in detail based on examples, but is not limited to the examples.

Example 1

A batch was prepared to have a composition of 62% by mol SnO, 22% by mol $P_2O_5$, 11% by mol $B_2O_3$, 2% by mol $Al_2O_3$ and 3% by mol MgO, and then was melted into glass at 1000° C. for two hours. Part of the molten glass thus obtained was formed into a film shape by roll forming, and the rest was poured into a carbon frame to obtain a block-shaped glass.

The block-shaped glass was cut out into a predetermined size. The cut piece was measured for the coefficient of thermal expansion in the temperature range of 30° C. to 380° C. with a dilatometer. The coefficient of thermal expansion of the glass obtained was $140 \times 10^{-7}/°$ C.

Next, the film-shaped glass piece was pulverized for 15 minutes with a stone mill and passed through a 100 micrometer sieve to obtain a glass powder ($D_{50}$: 14 μm, $D_{max}$: 145 μm). A barium silicate-based yellow phosphor powder was added to the obtained glass powder to form a powder mixture, and the powder mixture was press molded into a tablet, thereby obtaining a preform. The proportion of the phosphor powder in the powder mixture was 5% by mass. The obtained preform was sintered at 370° C. for 30 minutes in a reduced-pressure atmosphere of 200 Pa, thereby obtaining a sintered powder product.

The obtained sintered powder product was processed to a diameter Φ of 7 mm and a thickness of 1.5 mm, thereby obtaining a re-press-molding precursor. The re-press-molding precursor was re-press molded at 360° C. in a nitrogen atmosphere with a precision glass press machine (manufactured by Tsunanaka Manufacture Co. Inc.), thereby obtaining a meniscus lens-shaped wavelength conversion member (the concave part of which has a depth of 1.5 mm and the thickness of which is 0.8 mm). The appearance of the wavelength conversion member thus obtained was yellow.

The die used for the re-press molding was made of stainless steel, had a coefficient of thermal expansion of $120 \times 10^{-7}/°$ C. in the temperature range of 30° C. to 380° C. and an average surface roughness Ra of 0.02 μm, and had a raised part with a height of 1.5 mm.

The wavelength conversion member obtained by the re-press molding could be easily removed from the die and produced no crack.

The linear grooves in the surface of the wavelength conversion member were measured for length with a SEM and measured for depth along the lines perpendicular to the linear grooves with a stylus surface roughness measuring instrument (SURFCOM manufactured by Tokyo Seimitsu Co., Ltd.). From the measurement results was determined the number of linear grooves with a length of 30 μm or more and a depth of 0.05 μm or more existing per 0.5 mm square in the surface of the wavelength conversion member. The measurements were performed at several locations in the member surface, and the number of linear grooves was calculated as an average of the results determined at the locations.

The concave part of the obtained meniscus lens-shaped wavelength conversion member was filled with a silicone resin and bonded onto an excitation blue LED (driven at 20 mA), thereby producing a white LED device. The obtained LED device was allowed to emit light in a calibrated integrating sphere, and the luminescence spectra were retrieved into a PC through a small-sized spectrometer (USB2000 manufactured by Ocean Photonics). From the obtained luminescence spectra were calculated the total flux (lm) and the chromaticity. Ten samples of Sample Nos. 1 to 10 were produced, and their total fluxes and chromaticities were measured. The results are shown in TABLE 1.

TABLE 1

| Sample No. | Total Flux (1 m) | Chromaticity x | Chromaticity y |
|---|---|---|---|
| 1 | 1.68 | 0.318 | 0.339 |
| 2 | 1.70 | 0.317 | 0.338 |
| 3 | 1.67 | 0.319 | 0.339 |
| 4 | 1.67 | 0.318 | 0.339 |
| 5 | 1.70 | 0.317 | 0.338 |
| 6 | 1.67 | 0.317 | 0.338 |
| 7 | 1.69 | 0.317 | 0.337 |
| 8 | 1.69 | 0.318 | 0.339 |
| 9 | 1.68 | 0.318 | 0.338 |
| 10 | 1.67 | 0.317 | 0.338 |
| Average | 1.68 | 0.318 | 0.338 |

As is evident from TABLE 1, the wavelength conversion member obtained according to Example 1 exhibited extremely small variations in luminescence intensity and chromaticity.

Example 2

A wavelength conversion member was produced and measured for total flux in the same manners as in Example 1 except that the atmosphere during heat treatment (sintering) to the preform was changed to an air atmosphere. The results are shown in TABLE 2.

Example 3

A wavelength conversion member was produced and measured for total flux in the same manners as in Example 1 except that the average surface roughness Ra of the die was changed to 0.65 μm. The results are shown in TABLE 2.

Example 4

A wavelength conversion member was produced and measured for total flux in the same manners as in Example 1 except that the material of the die was changed to tungsten carbide having a coefficient of thermal expansion of $40 \times 10^{-7}/°$ C. The results are shown in TABLE 2. In this example, after re-press molding, the wavelength conversion member stuck to the die to have difficulty in removal from the die.

Example 5

A low-melting-point glass block having a lower softening point than the glass powder used for the wavelength conversion member obtained in Example 1 was set in the concave part of the wavelength conversion member and deformed by softening at a temperature near the softening point, thereby bringing it into adhere to the wavelength conversion member. Next, the wavelength conversion member was bonded onto an excitation blue LED (driven at 20 mA), thereby producing an LED device. The obtained LED device was measured for total flux in the same manner as in Example 1. The results are shown in TABLE 2.

Example 6

The wavelength conversion member obtained in Example 1 was bonded onto an excitation blue LED (driven at 20 mA) with filling the concave part with nothing, thereby producing an LED device. The obtained LED device was measured for total flux in the same manner as in Example 1. The results are shown in TABLE 2.

As a result of an observation on the surface of the wavelength conversion member with a SEM, a large number of linear grooves with a length of 30 μm or more were found. The linear grooves was found to have depths from 0.1 to 1.0 μm as measured along the lines perpendicular to the linear grooves with a stylus surface roughness measuring instrument. It can be assumed that the linear grooves are polishing scratches.

TABLE 2

| | Examples | | | | | |
|---|---|---|---|---|---|---|
| | 1 | 2 | 3 | 4 | 5 | 6 |
| Glass | $SnO$—$P_2O_5$—$B_2O_3$-Based Glass | | | | | |
| Sintering Temperature (° C.) | 370 | 370 | 370 | 370 | 370 | 370 |
| Softening Point of Glass (° C.) | 355 | 355 | 355 | 355 | 355 | 355 |
| Refractive Index of Glass | 1.80 | 1.80 | 1.80 | 1.80 | 1.80 | 1.80 |
| $D_{50}/D_{max}$ of Glass Powder (μm) | 14/145 | 14/145 | 14/145 | 14/145 | 14/145 | 14/145 |
| Re-press Molding Temperature (° C.) | 360 | 360 | 360 | 360 | 360 | 360 |
| Re-press Molding Atmosphere | $N_2$ | Air | $N_2$ | $N_2$ | $N_2$ | $N_2$ |
| Surface Roughness of Die (μm) | 0.02 | 0.02 | 0.65 | 0.02 | 0.02 | 0.02 |
| Expansion Coefficient of Die ($\times 10^{-7}$/° C.) | 120 | 120 | 120 | 40 | 120 | 120 |
| Expansion Coefficient of Glass ($\times 10^{-7}$/° C.) | 140 | 140 | 140 | 140 | 140 | 140 |
| Filler | Silicone Resin | Silicone Resin | Silicone Resin | Silicone Resin | Glass | — |
| Refractive Index of Filler | 1.52 | 1.52 | 1.52 | 1.52 | 1.75 | — |
| Shape | Meniscus Lens Shape | Meniscus Lens Shape | Meniscus Lens Shape | Meniscus Lens Shape(*) | Meniscus Lens Shape | Meniscus Lens Shape |
| Appearance | Yellow | Yellow | Yellow | Yellow | Yellow | Yellow |
| Total Light Transmittance (%) | 23 | 24 | 24 | 24 | 23 | 23 |
| Number of Linear Grooves | 3 | 8 | 56 | 9 | 3 | 3 |
| Total Flux (lm) | 1.68 | 1.62 | 1.51 | 1.61 | 1.71 | 1.61 |

(*)After re-press molding, the wavelength conversion member stuck to the die to have difficulty in removal from the die.

Example 7

The surface of the re-press-molding precursor in Example 1 was polished using a diamond slurry (with a particle diameter of 3 μm). The thickness of the re-press-molding precursor after polished was 1.00 mm. Thereafter, the re-press-molding precursor was re-press molded into a plate shape at 360° C. in a nitrogen atmosphere with a precision glass press machine, thereby obtaining a wavelength conversion member with a thickness of 0.8 mm. No concave part with a depth of 0.1 mm or more existed in the obtained wavelength conversion member. The die used was made of stainless steel and had a coefficient of thermal expansion of $120 \times 10^{-7}$/° C. and an average surface roughness Ra of 0.02 μm.

As a result of an observation on the surface with a SEM, not only linear grooves but also linear ridges with a length of 10 μm or more were found. The height of the linear ridges was 0.1 μm as measured along the lines perpendicular to the linear ridges with a stylus surface roughness measuring instrument.

The obtained wavelength conversion member was set on an excitation blue LED (driven at 20 mA) and determined for total flux in the same manner as in Example 1. The results are shown in TABLE 3.

Comparative Example 1

The sintered powder product in Example 1 was polished to have a mirror surface using a diamond slurry (with a particle diameter of 3 μm), thereby obtaining a plate-shaped wavelength conversion member with a thickness of 0.8 mm.

Note that no concave part with a depth of 0.1 mm or more existed in the obtained wavelength conversion member.

The obtained wavelength conversion member was set on an excitation blue LED (driven at 20 mA) and determined for total flux in the same manner as in Example 1. The results are shown in TABLE 3.

TABLE 3

| | Example 7 | Comparative Example 1 |
|---|---|---|
| Glass | $SnO$—$P_2O_5$—$B_2O_3$-Based Glass | $SnO$—$P_2O_5$—$B_2O_3$-Based Glass |
| Sintering Temperature (° C.) | 370 | 370 |
| Softening Point of Glass (° C.) | 355 | 355 |
| Re-press Molding Temperature (° C.) | 360 | — |
| Re-press Molding Atmosphere | $N_2$ | — |
| Surface Roughness of Die (μm) | 0.02 | — |
| Expansion Coefficient of Die ($\times 10^{-7}$/° C.) | 120 | — |
| Expansion Coefficient of Glass ($\times 10^{-7}$/° C.) | 140 | 140 |
| Shape | Thin Plate Shape | Thin Plate Shape |
| Appearance | Yellow | Yellow |
| Number of Linear Grooves | 8 | 127 |
| Total Flux (lm) | 1.57 | 1.38 |

As is evident from TABLE 3, it can be seen that the wavelength conversion member of Example 7 comprising a re-press molded product has an excellent luminescence intensity compared to the wavelength conversion member of Comparative Example 1.

Example 8

A wavelength conversion member was produced in the same manner as in Example 1 except that the surface of the wavelength conversion member after re-press molded was etched for one minute using a 2% sulfuric acid aqueous solution. When the total flux of the obtained wavelength conversion member was measured, it was 1.93 lm.

The invention claimed is:

1. A wavelength conversion member comprising:
   a re-press molded product of a sintered powder product of a powder mixture containing a glass powder and an inorganic phosphor powder; wherein
   the softening point of the glass powder is 600° C. or below.

2. The wavelength conversion member of claim 1, wherein the number of linear grooves with a length of 30 μm or more and a depth of 0.05 μm or more existing in the surface thereof is 100 or less on an average per 0.5 mm square.

3. The wavelength conversion member of claim 1, wherein the total light transmittance at a wavelength of 550 nm and a thickness of 1 mm is 10% or more.

4. The wavelength conversion member of claim 1, having a concave part with a depth of 0.1 mm or more formed in the surface thereof.

5. The wavelength conversion member of claim 4, wherein the concave part is filled with a transparent resin or a low-melting-point glass.

6. The wavelength conversion member of claim 5, wherein the refractive index nd of the transparent resin or the low-melting-point glass is 1.4 to 2.0.

7. The wavelength conversion member of claim 5, wherein the transparent resin is a silicone resin.

8. The wavelength conversion member of claim 5, wherein the difference between the refractive index nd of the glass powder and the refractive index nd of the transparent resin or the low-melting-point glass is 0.7 or less.

9. The wavelength conversion member of claim 1, wherein the refractive index nd of the glass powder is 1.5 to 2.1.

10. The wavelength conversion member of claim 1, wherein the glass powder is a $SnO$—$P_2O_5$—$B_2O_3$-based glass.

11. The wavelength conversion member of claim 10, wherein the glass powder has a composition of 35% to 80% by mol $SnO$, 5% to 40% by mol $P_2O_5$, and 1% to 30% by mol $B_2O_3$.

12. The wavelength conversion member of claim 11, wherein the composition of the glass powder further contains 0% to 10% by mol $Al_2O_3$, 0% to 10% by mol $SiO_2$, 0% to 10% by mol $Li_2O$, 0% to 10% by mol $Na_2O$, 0% to 10% by mol $K_2O$, 0% to 10% by mol $Li_2O+Na_2O+K_2O$, 0% to 10% by mol $MgO$, 0% to 10% by mol $CaO$, 0% to 10% by mol $SrO$, 0% to 10% by mol $BaO$, and 0% to 10% by mol $MgO+CaO+SrO+BaO$.

13. An LED device comprising the wavelength conversion member of claim 1.

* * * * *